United States Patent
Yamaguchi

(10) Patent No.: US 8,108,807 B2
(45) Date of Patent: Jan. 31, 2012

(54) DELAY TIME ADJUSTING METHOD OF SEMICONDUCTOR INTEGRATED CIRCUIT

(75) Inventor: Toshihide Yamaguchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 763 days.

(21) Appl. No.: 12/219,840

(22) Filed: Jul. 29, 2008

(65) Prior Publication Data

US 2009/0033397 A1  Feb. 5, 2009

(30) Foreign Application Priority Data

Jul. 31, 2007  (JP) ................................. 2007-198890

(51) Int. Cl.
*G06F 17/50* (2006.01)
(52) U.S. Cl. ........ 716/100; 716/108; 716/132; 716/134; 716/136
(58) Field of Classification Search .................. 716/100, 716/108, 132, 134, 136
See application file for complete search history.

(56) References Cited

U.S. PATENT DOCUMENTS

| | | | |
|---|---|---|---|
| 2007/0007996 A1* | 1/2007 | Ranganathan et al. | 326/34 |
| 2007/0032089 A1* | 2/2007 | Nuzzo et al. | 438/725 |
| 2007/0128782 A1* | 6/2007 | Liu et al. | 438/187 |
| 2008/0001252 A1* | 1/2008 | Lee et al. | 257/529 |
| 2008/0218247 A1* | 9/2008 | Park et al. | 327/525 |

FOREIGN PATENT DOCUMENTS

JP   4-247653   9/1992

* cited by examiner

*Primary Examiner* — Paul Dinh
(74) *Attorney, Agent, or Firm* — McGinn IP Law Group, PLLC

(57) ABSTRACT

The delay time variation of transistors caused by the manufacturing variation is desired to be adjusted. A relation table storing a relation between sizes and voltage values (supply voltages and bias voltages) is provided. Macros each of which includes a transistor and a setting voltage generation circuit for applying a setting voltage to the transistor are formed on a chip. A process data indicating a size of the transistor is generated. The voltage value corresponding to the size of the transistor indicated by the process data in the relation table is selected as an optimum voltage value (supply voltage Vdd, bias voltage Bias) for each of the macros. The setting voltage of each of the macros is set to the optimum voltage value. The delay time can be adjusted without requiring a detection circuit for detecting the delay time.

22 Claims, 9 Drawing Sheets

Fig. 8

4: PROCESS DATA

| X | Y | Lsem[nm] |
|---|---|---|
| 0 | 0 | w |
| 1 | 1 | w |
| 2 | 2 | x |
| 3 | 3 | y |
| 4 | 4 | w |
| 5 | 5 | z |
| ... | ... | ... |

+

5: RELATION TABLE

| CONDITION No. | MASK SIZE [nm] | AVE Ion CHARACTERISTIC [μA/μm] | τpd [psec] | BIAS VOLTAGE [V] | SUPPLY VOLTAGE [V] |
|---|---|---|---|---|---|
| ① | A | P | V | 0 | |
| ② | B | Q | W | 0.1 | |
| ③ | C | R | X | 0.2 | |
| ④ | D | S | Y | 0.3 | |
| ⑤ | E | T | Z | 0.4 | |
| ... | ... | ... | ... | ... | ... |

⇓

6: VOLTAGE-POSITION CORRESPONDENCE DATA

| X | Y | Bias[V] | Vdd[V] |
|---|---|---|---|
| 0 | 0 | B | P |
| 1 | 1 | B | P |
| 2 | 2 | C | Q |
| 3 | 3 | E | R |
| 4 | 4 | B | P |
| 5 | 5 | A | O |
| ... | ... | ... | ... |

# DELAY TIME ADJUSTING METHOD OF SEMICONDUCTOR INTEGRATED CIRCUIT

INCORPORATION BY REFERENCE

This Patent Application is based on Japanese Patent Application No. 2007-198890. The disclosure of the Japanese Patent Application is incorporated herein by reference.

BACKGROUND OF THE INVENTION

1. Field of the Invention

The present invention relates to a manufacturing method of a semiconductor integrated circuit and, more specifically, to a method for adjusting delay time variation caused due to the variation of transistor occurred in manufacturing process.

2. Description of Related Art

In accordance with a demand for a finer structure of CMOS (Complementary Metal Oxide Semiconductor) LSI (Large-Scale Integrated circuit), the variation in sizes of gates (corresponding layout pattern in a mask, after photoresist mask processing (referred to as PR in the following), and after etching (referred to as ET in the following)) on a chip surface tends to affect a transistor characteristic variation within a chip surface. In particular, it tends to become prominent in the 65-nm generation and thereafter.

FIG. 1 shows a structure of a semiconductor integrated circuit described in Japanese Laid-Open Patent Application JP-A-Heisei, 4-247653 as a referential example of a semiconductor integrated circuit. The semiconductor integrated circuit includes a gate circuit 110 having a transistor, a delay time detection circuit 111, and a substrate bias voltage generating circuit 112. The gate circuit 110, the delay time detection circuit 111, and the substrate bias voltage generating circuit 112 are formed on a chip.

The delay time detection circuit 111 detects a delay time between the time where a supply voltage is applied to the gate circuit 110 (a gate of the transistor) and the time where the gate circuit 110 starts an operation (namely, when the transistor is turned ON). The delay time depends on a supply voltage applied to the transistor, environmental temperatures of the transistor, manufacturing processes, and the like. The substrate bias voltage generating circuit 112 generates a substrate bias voltage corresponding to a detected result of the delay time. In this referential example of a semiconductor integrated circuit, the delay time variation caused due to manufacture variation of the gate circuit 110 (the transistor) is adjusted in this manner.

SUMMARY

With a referential example of a semiconductor integrated circuit, the delay time variation caused due to the manufacture variations of the gate circuit 110 (the transistor) is adjusted after it is being shipped or sold, for example, i.e., when it is used by a user. Therefore, with the referential example of a semiconductor integrated circuit, it is necessary to provide the aforementioned delay time detection circuit 111 on the chip. This raises a problem that the area for such a circuit is required on the chip.

In an aspect of the present invention, a delay time adjustment method for adjusting a delay time of a transistor is applied to a semiconductor integrated circuit including a plurality of macros formed on a chip, and the transistor and a setting voltage generation circuit designed to apply a setting voltage to the transistor are included in each of the plurality of macros. The delay time adjustment method includes: storing a plurality of sizes and a plurality of voltage values which are related to each other in a relation table; generating process data indicating a size of the transistor of a plurality of macros on the chip; selecting a voltage value corresponding to the size of each of the plurality of macros indicated in the process data from the plurality of voltage values as an optimum voltage value which is related to the size in the relation table; and setting the setting voltage of the setting voltage generation circuit of each of the plurality of macros to the optimum voltage value.

According to the above mentioned configuration, a delay time variation caused due to manufacture variation of a transistor can be adjusted by determining a setting voltage applied to the transistor based on a size of the transistor (especially, based on the size of the gate) and by setting a setting voltage to a setting voltage generation circuit.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8 is an illustration for describing an operation (step S3, S11, S12) of the system shown in FIG. 2;

DESCRIPTION OF THE PREFERRED EMBODIMENTS

Hereinafter, a manufacturing method, delay time adjustment method and delay time adjustment device according to embodiments of the present invention will be described with reference to the attached drawings.

(Configurations)

Figure 1:
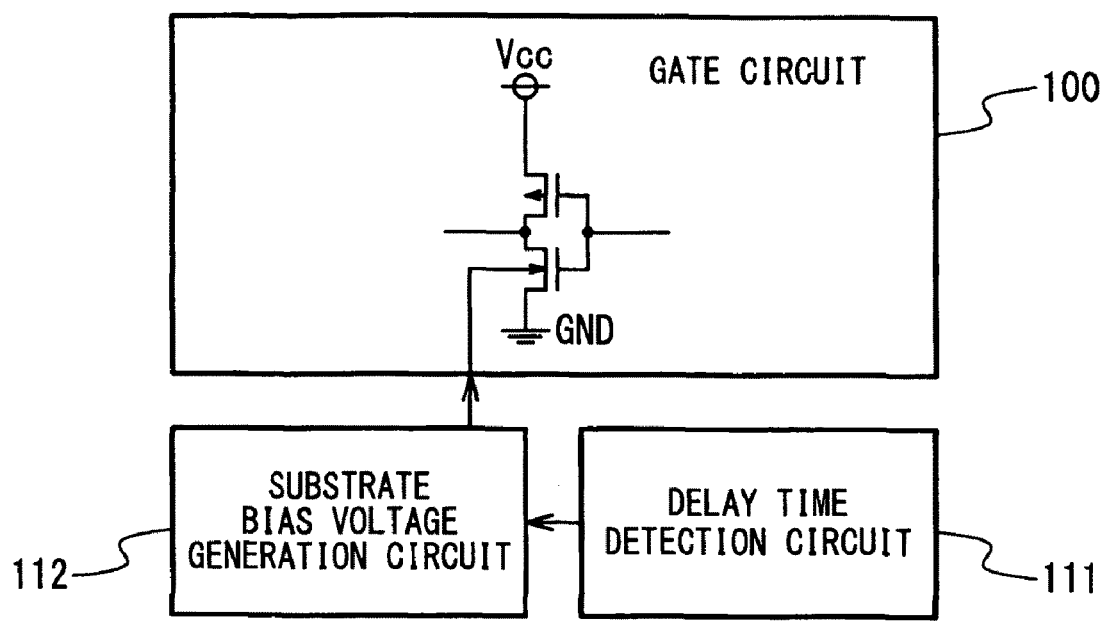
FIG. 1 shows a structure of a referential example of a semiconductor integrated circuit.
Figure 2:
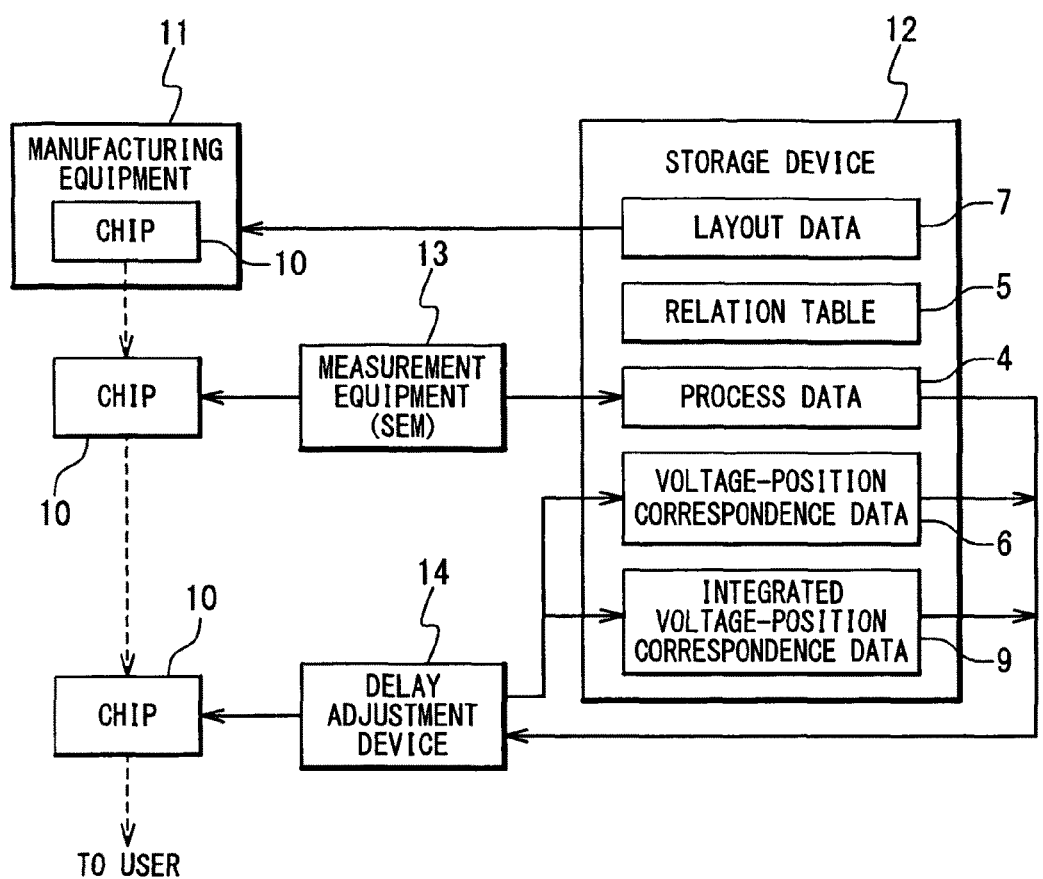
FIG. 2 shows a structure of a system to which a manufacturing method for a semiconductor integrated circuit according to an embodiment of the present invention is applied.

FIG. 2 shows a structure of a system to which a manufacturing method for a semiconductor integrated according to an embodiment of the present invention is applied. The system includes manufacturing equipment 11, measurement equipment 13, a storage device 12, and a delay time adjustment device 14. The storage device 12 stores a relation table 5. The storage device 12 further stores layout data 7

Figure 3:
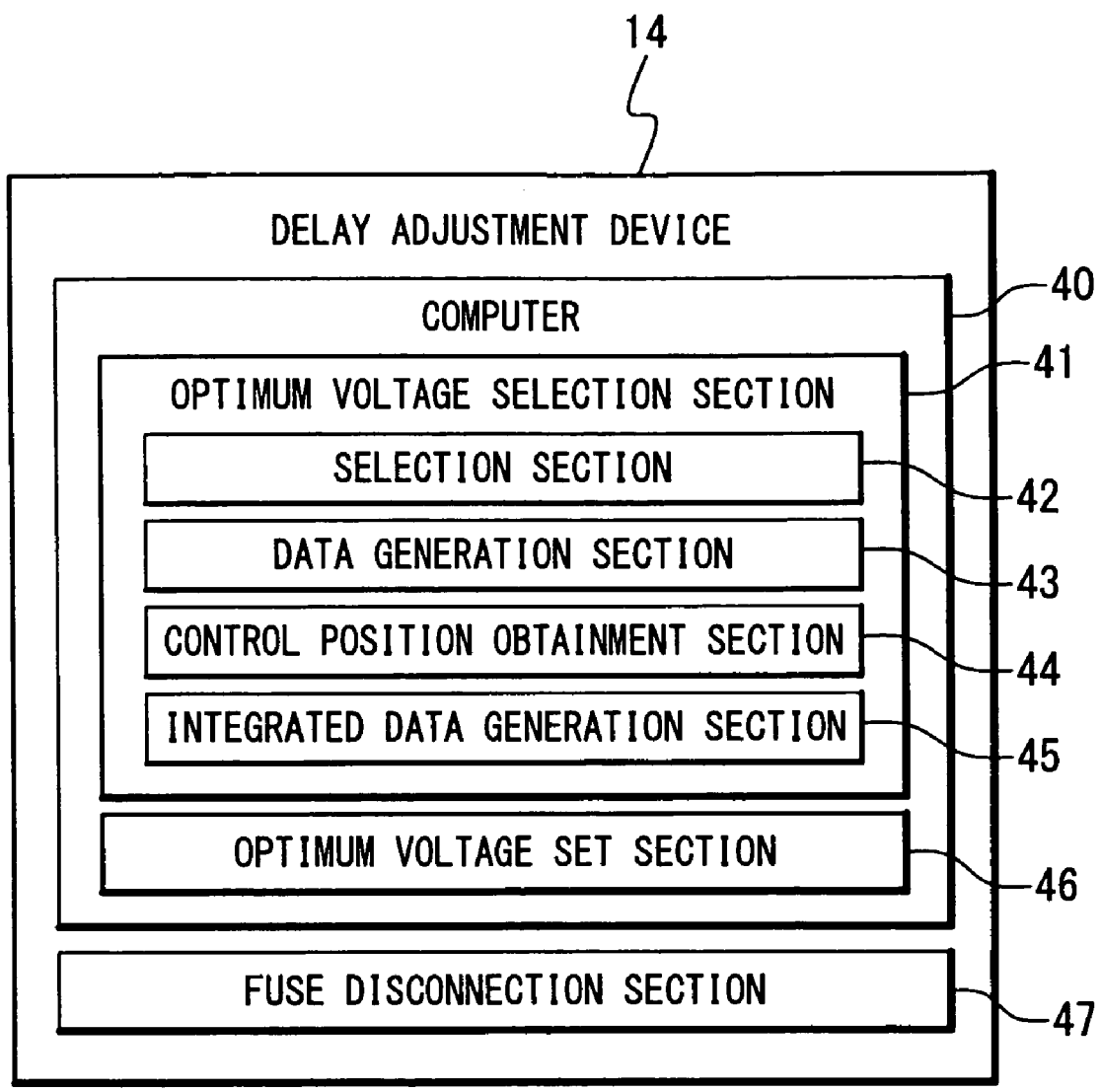
FIG. 3 shows a structure of a delay time adjustment device 14 shown in FIG. 2.

FIG. 3 shows a structure of the delay time adjustment device 14 shown in FIG. 2. The delay time adjustment device 14 includes a computer 40 and a fuse disconnection section 47.

The computer 40 includes a CPU (Central Processing Unit) and a memory to which a computer program executed by the CPU is stored. The computer program includes an optimum voltage selection section 41 and an optimum voltage set section 46. The optimum voltage selection section 41 includes a selection section 42, a data generation section 43, a control position set section 44, and an integrated data generation section 45. Operations of the optimum voltage selection section 41 (the selection section 42, the date generating part 43, the control position set section 44, and the integrated data generation section 45), the optimum voltage set section 46, and the fuse disconnection section 47 will be described later.

(Operations)

Figure 4:
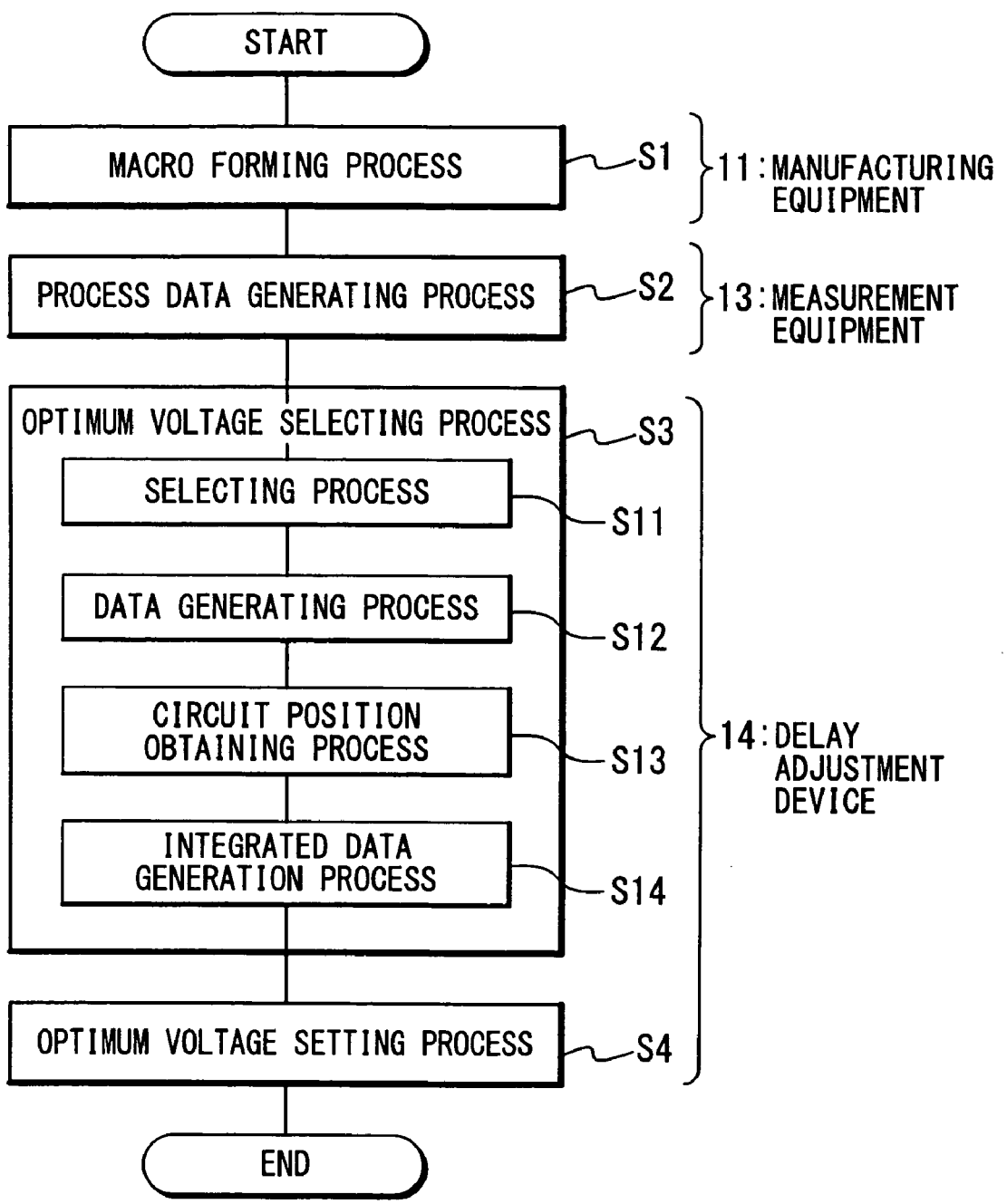
FIG. 4 shows a flowchart showing an operation of the system shown in FIG. 2 corresponding to the manufacturing method for the semiconductor integrated circuit (steps S1 to S4) according to an embodiment of the present invention.

FIG. 4 shows a flowchart showing an operation of the system shown in FIG. 2 corresponding to a manufacturing method of a semiconductor integrated circuit (steps S1 to S4) according to an embodiment of the present invention. Steps S2 to S4 to be described later show a delay time adjusting method employed in the semiconductor integrated circuit.

Figure 5:
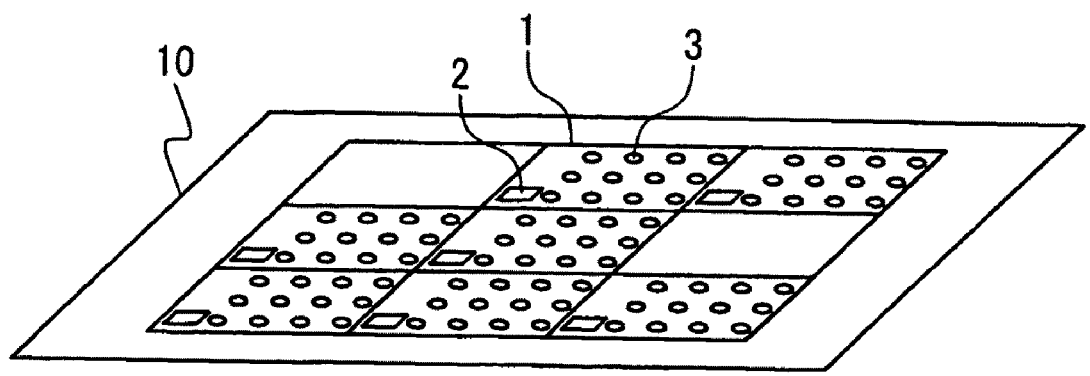
FIG. 5 shows a view of the structure of a semiconductor integrated circuit of an embodiment of the present invention for explaining the operation (step S1) of the system shown in FIG. 2.

The aforementioned layout data 7 shows a layout when a plurality of macros are arranged on a chip 10. As shown in FIG. 5, the manufacturing equipment 11 forms a plurality of macros 1 on the chip 10 based on the layout data 7 (step S1: macro forming processing). Each of the plurality of macros 1 includes a group of transistors 3 and a setting voltage generation circuit 2.

Figure 6:
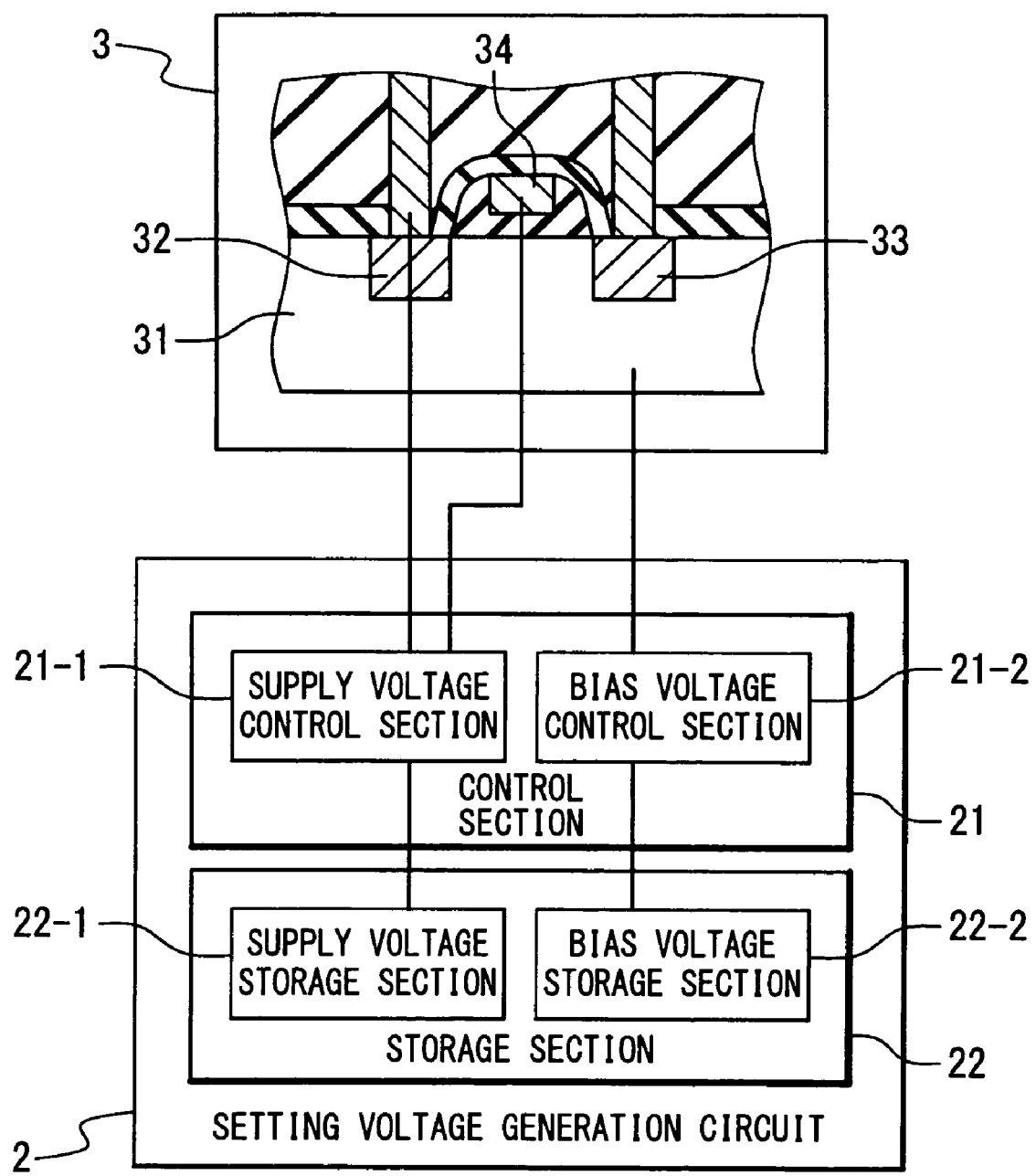
FIG. 6 is an illustration for describing an operation (step S1) of the system shown in FIG. 2.

As shown in FIG. 6, each of the group of transistors 3 is formed on a semiconductor substrate 31 that is provided on the chip 10. Specifically, a first $SiO_2$ film as a gate oxide film is formed on the surface of the first conductivity type semiconductor substrate 31. A gate 34 is formed on the surface of the first $SiO_2$ film by lithography and plasma etching. Then, second conductivity type diffusion layers 32 and 33 are formed on the surface of the semiconductor substrate 31 by performing ion implantation. The diffusion layers 32 and 33 are used as a drain and a source, respectively. Then, a silicon nitride film (SiON film) is formed on surfaces of the semiconductor substrate 31, the diffusion layers 32, 33, the first $SiO_2$ film, and the gate 34. The SiON film is used as a protection film and an etching stopper.

Then, a second $SiO_2$ film is formed on the surface of the SiON film. Then, a first contact hole (not shown) extended from the surface of the second $SiO_2$ film to the surface of the diffusion layer 32 is formed through the second $SiO_2$ film and the SiON film, and a second contact hole (not shown) extended from the surface of the second $SiO_2$ film to the surface of the diffusion layer 33 is formed through the second $SiO_2$ film and the SiON film. Then, a first metal layer and a second metal layer are formed in the first contact hole and the second contact hole, respectively. The first and second metal layers are connected to the diffusion layers 32 and 33 (a drain and a source), respectively.

As shown in FIG. 6, the setting voltage generation circuit 2 includes a control section 21 and a storage section 22. The storage section 22 includes a fuse circuit for registering setting voltages. The setting voltages include at least one of a supply voltage and a bias voltage. The storage section 22 includes a supply voltage storage section 22-1 having a group of fuses for registering the supply voltage, and a bias voltage storage section 22-2 having a group of fuses for registering the bias voltage. Examples of the group of fuses for the supply voltage storage section 22-1 and the bias voltage storage section 22-2 are laser trimming fuses and electric fuses (current fuses). The control section 21 includes: a supply voltage control section 21-1 for applying the supply voltage registered to the supply voltage storage section 22-1 to the drains 32 or the sources 33 of the group of transistors 3; and a bias voltage control section 21-2 for applying the bias voltage registered to the bias voltage storage section 22-2 to the semiconductor substrates 31. Further, the supply voltage is used as a switching voltage to be applied to the gates 34 of the group of transistors 3. In that case, the supply voltage control section 21-1 applies the supply voltage to the gates 34 of the transistors 3 at a prescribed timing.

Figure 7:
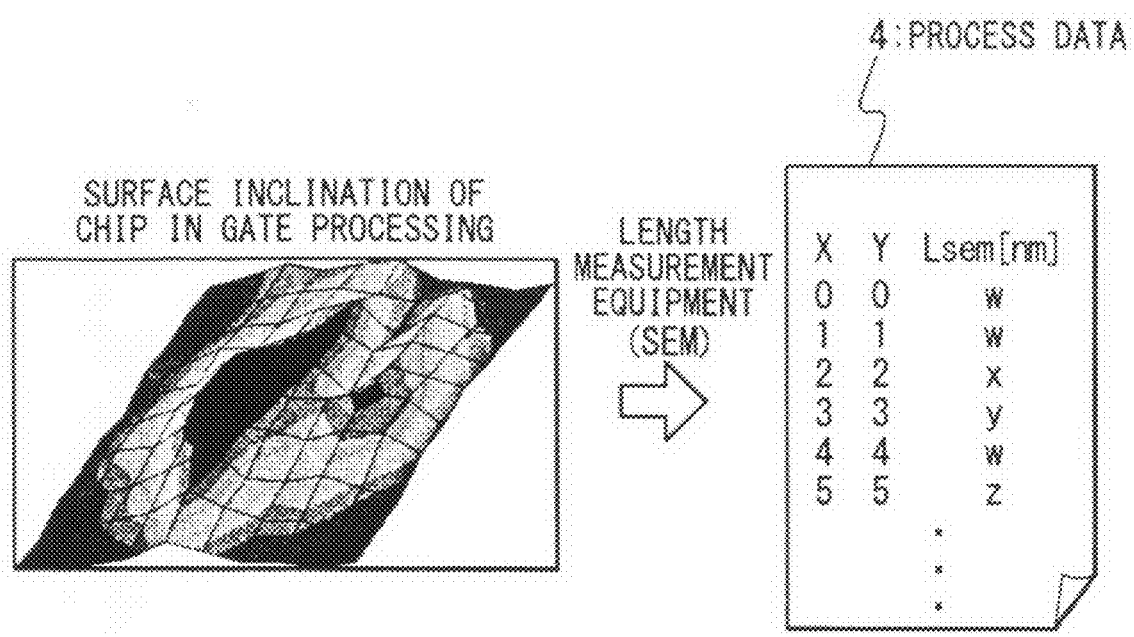
FIG. 7 is an illustration for describing an operation (step S2) of the system shown in FIG. 2.

As shown in FIG. 7, in the macro forming processing (step S1), the measurement equipment 13 measures the size Lsem (a length measured pattern) when the gates 34 of the group of transistors 3 are formed on the chip 10 for each of the plurality of macros 1, and position information (X, Y) indicating the positions thereof by using length measurement equipment such as an SEM (Scanning Electron Microscope) or the like. The size Lsem represents an average size of the gates 34 when the gates 34 of the group of transistors 3 are formed on the chip 10. The more the number of the length measured patterns measured by the measurement equipment 13 becomes, the better the precise average value of the size Lsem (the length measured pattern) can be obtained. Further, the size Lsem includes at least one selected from the size in mask, the size after photoresist mask processing (referred to as PR in the following), and the size after etching (referred to as ET in the following). Furthermore, the measurement equipment 13 measures electric characteristics of the group of transistors 3 for each of the plurality of macros 1 and outputs measurement values. This measurement value indicates an average value when the electric characteristics of the group of transistors 3 are measured. Examples of the electric characteristics are a current value Ion (Ion characteristic) when the group of transistors 3 is turned on, a delay time τpd between the time when the supply voltage is applied to the gates of the group of transistors 3 and the time when the group of transistors 3 is turned on, and the like. The measurement equipment 13 generates process data 4 that shows position information (X, Y) for each of the plurality of macros 1, the size Lsem, and the electric characteristics (not shown), and stores the process data 4 to the storage device 12 (step S2: process data generating processing).

The optimum voltage selection section 41 (the selection section 42, the data generation section 43, the control position set section 44, and the integrated data generation section 45) of the delay time adjustment device 14 executes the optimum voltage value selecting process (step S3).

As shown in FIG. 8, some kinds of sizes (size in the mask, size after PR, and size after ET), some kinds of electric characteristics (the ion characteristic, the delay time τpd), and some kinds of voltage values (the supply voltage, the bias voltage) are registered to the relation table 5. In the optimum voltage selecting process (step S3), the selection section 42 refers to the relation table 5 and the storage device 12, and selects the voltage values corresponding to the size Lsem (size of the mask, the size after PR, and the size after ET) and the electric characteristics (the ion characteristic, the delay time τpd) of each of the plurality of macros 1, which are shown in the process data 4, from the plurality of voltage values (the supply voltage, the bias voltage), as the optimum voltage values (the supply voltage Vdd, the bias voltage Bias) (step S11: selecting process).

As shown in FIG. 8, the data generation section 43 generates voltage-position correspondence data 6 in which the position information (X, Y) in each of the plurality of macros 1 shown in the process data 4 and the optimum voltage values (the supply voltage Vdd, the bias voltage Bias) that are selected by the selecting process (step S11) are linked, and stores it to the storage device 12 (step S12: data generating process).

Figure 9:
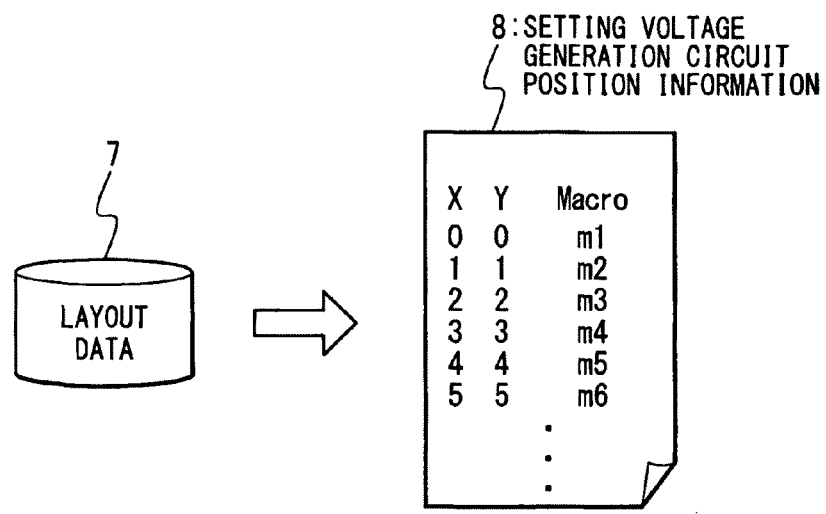
FIG. 9 is an illustration for describing an operation (step S3, S13) of the system shown in FIG. 2.

As shown in FIG. 9, the control position set section 44 refers to the storage device 12, searches positions of the setting voltage generation circuits 2 in each of the plurality of macros 1 based on the layout data 7 as searching positions, and obtains setting voltage generation circuit position information 8 (X, Y, Macro) which shows the searching positions (step S13: circuit position obtaining process). The setting voltage generation circuit position information 8 indicates the positions of the setting voltage circuits 2 on the chip 10.

Figure 10:
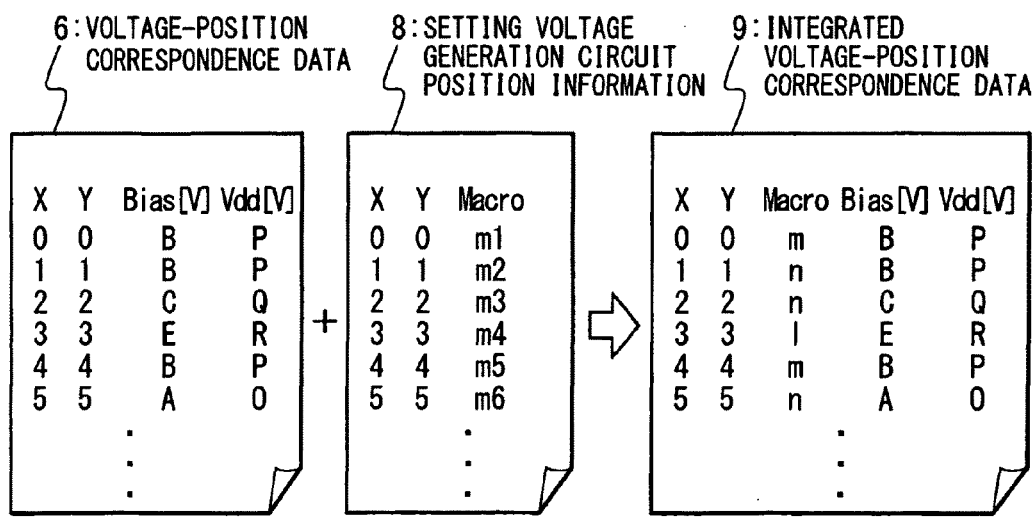
FIG. 10 is an illustration for describing an operation (step S3, S14) of the system shown in FIG. 2.

As shown in FIG. 10, the integrated data generation section 45 generates integrated voltage-position correspondence data 9, in which the position information (X, Y) in each of the plurality of macros 1 as well as the optimum voltage values (the supply voltage Vdd, the bias voltage Bias) indicated in the voltage-position correspondence data 6 and the setting voltage generation circuit position information 8 (X, Y, Macro) are linked, and stores it to the storage device 12 (step S14: integrated data generating process).

The optimum voltage set section 46 and the fuse disconnection section 47 of the delay time adjustment device 14 execute the optimum voltage setting process (step S4).

In the optimum voltage setting process (step S4), the optimum voltage set section 46 refers to the storage device 12, and outputs a fuse disconnecting instruction to the fuse disconnection section 47 for setting the optimum voltage values (the supply voltage Vdd, the bias voltage Bias) to the setting voltage generation circuits 2 of each macro 1 based on the integrated voltage-position correspondence data 9.

When the fuse disconnecting instruction indicates setting of the supply voltage, the fuse disconnection section 47 disconnects the fuse indicating the optimum voltage value (the supply voltage Vdd) among the group of fuses of the supply voltage storage section 22-1 of the setting voltage generation circuit 2 according to the fuse disconnecting instruction. In this case, the optimum voltage value (the supply voltage Vdd) is registered to the supply voltage storage section 22-1 as the setting voltage.

When the fuse disconnecting instruction indicates setting of the bias voltage, the fuse disconnection section 47 disconnects the fuse indicating the optimum voltage value (the bias voltage Bias) among the group of fuses of the bias voltage storage section 22-2 of the setting voltage generation circuit 2 according to the fuse disconnecting instruction. In this case, the optimum voltage value (the bias voltage Bias) is registered to the bias voltage storage section 22-2 as the setting voltage.

Here, when the group of fuses of the supply voltage storage section 22-1 and the bias voltage storage section 22-2 are laser trimming fuses, the fuse disconnection section 47 irradiates a laser to the fuse indicating the optimum voltage value among the group of fuses to disconnect the fuse. When the group of fuses is electric fuses, the fuse disconnection section 47 has a current flown to the fuse indicating the optimum voltage value to disconnect the fuse.

(Effects)

As described above, with the manufacturing method for the semiconductor integrated circuit according to embodiments of the present invention, the relation table 5 having plural kinds of sizes and plural kinds of voltage values being registered is prepared. The manufacturing equipment 11 forms a plurality of macros 1 including the transistors 3 and the setting voltage generation circuit 2 for applying the setting voltage to the transistors 3 on the chip 10. The measurement equipment 13 generates the process data 4 which shows the sizes of the transistors 3 for each of the plurality of macros 1 on the chip 10, and stores it to the storage device 12. The delay time adjustment device 14 refers to the relation table 5 and the storage device 12, selects, the voltage value corresponding to the sizes in each of the plurality of macros 1 shown by the process data 4 from the plurality of voltage values as the optimum voltage value, and sets the optimum voltage value to each of the setting voltage generation circuits 2 of the plurality of macros 1 as the setting voltage. As described above, with the manufacturing method for the semiconductor integrated circuit according to embodiments of the present invention, it is possible to adjust a delay time variation caused due to the manufacture variations of the transistors 3 by determining the setting voltages to be applied to the transistors 3 based on the sizes of (the gates 34) of the transistors 3 and setting the setting voltages to the setting voltage generation circuits 2.

Further, with the method for manufacturing the semiconductor integrated circuit according to embodiments of the present invention, the delay time variation caused due to the manufacture variations of the transistors 3 is adjusted before being used by a user, i.e., before the semiconductor integrated circuit is being shipped or sold. Thus, it is not necessary to provide a detection circuit (the delay time detection circuit 111) for detecting the delay time in the transistors 3 on the chip. Therefore, an area for that circuit can be reduced.

In the manufacturing method for the semiconductor integrated circuit according to embodiments of the present invention, the electric characteristics (the ion characteristic, the delay time $\tau pd$) depend on the size. Thus, it is possible to perform manufacturing methods according to embodiments of the present invention without the processing relevant to the electric characteristics (the ion characteristic, the delay time $\tau pd$).

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A manufacturing method of a semiconductor integrated circuit, said method comprising:
    storing a relation between a plurality of sizes and a plurality of voltage values in a relation table, as tangibly embodied in a machine-readable storage medium on a computer;
    forming a plurality of macros on a chip, wherein each of the plurality of macros includes a transistor and a setting voltage generation circuit designed to apply a setting voltage to the transistor;
    generating a process data indicating a size of the transistor of each of the plurality of macros, using a measurement device that provides output data as input data to the computer;
    selecting, using a processor on the computer, a voltage value corresponding to the size of the transistor of each of the plurality of macros indicated in the process data from the plurality of voltage values as an optimum voltage value which is related to the size in the relation table; and
    setting the setting voltage of the setting voltage generation circuit of each of the plurality of macros to the optimum voltage value, using a delay adjustment device controlled by the computer.

2. The manufacturing method according to claim 1, wherein the size is comprises a size of a gate of the transistor of each of the plurality of macros formed on the chip.

3. The manufacturing method according to claim 1, wherein the size is comprises information indicating at least one of a size of a mask of a gate of the transistor, a size of a gate of the transistor after a photoresist mask is formed and before an etching process, and a size of a gate of the transistor after the etching process of the transistor.

4. The manufacturing method according to claim 1, wherein the transistor is formed on a semiconductor substrate formed on the chip, and
the setting voltage comprises information indicating at least one of a bias voltage applied to the semiconductor substrate, a supply voltage applied to a drain or a source of the transistor, and a supply voltage applied to a gate of the transistor for switching of the gate.

5. The manufacturing method according to claim 1, wherein the setting voltage generation circuit includes a storage device for registering the setting voltage.

6. The manufacturing method according to claim 5, wherein the storing device includes a fuse circuit for storing the setting voltage.

7. The manufacturing method according to claim 1, wherein the process data includes position information indicating a position of the transistor of each of the plurality of macros on the chip, and
the selecting includes:
generating voltage-position correspondence data indicating a relation between the position information of each of the plurality of macros and the optimum voltage value selected by the selecting; and
generating integrated voltage-position correspondence data indicating a relation between the position information and the optimum voltage value of each of the plurality of macros which are represented in the voltage-position correspondence data, and setting voltage generation circuit position information indicating a position of the setting voltage generation circuit on the chip, and
the setting includes:
setting the setting voltage of the setting voltage generation circuit of each of the plurality of macros to the optimum voltage value based on the integrated voltage-position correspondence data.

8. The manufacturing method according to claim 7, wherein layout data indicating a layout of the plurality of macros is stored in a storage device, and
the forming includes:
forming the plurality of macros on the chip based on the layout data, and
the selecting includes:
obtaining a position of the setting voltage generation circuit of each of the macros by searching the layout data stored in the storage device.

9. A delay time adjustment method for adjusting a delay time of a transistor, applied to a semiconductor integrated circuit including a plurality of macros formed on a chip, the transistor and a setting voltage generation circuit designed to apply a setting voltage to the transistor being included in each of the plurality of macros, wherein the method comprises:
storing a plurality of sizes and a plurality of voltage values which are related to each other in a relation table, as tangibly embodied on a machine-readable storage device on a computer;
generating process data indicating a size of the transistor of a plurality of macros on the chip, using a measurement device that supplies data to the computer;
selecting, using a processor on the computer, a voltage value corresponding to the size of each of the plurality of macros indicated in the process data from the plurality of voltage values as an optimum voltage value which is related to the size in the relation table; and
setting the setting voltage of the setting voltage generation circuit of each of the plurality of macros to the optimum voltage value, using a delay adjustment device controlled by the computer.

10. The delay time adjustment method according to claim 9, wherein the size comprises a size of a gate of the transistor of each of the plurality of macros on the chip.

11. The delay time adjustment method according to claim 9, wherein the size comprises information including at least one of a size of a mask of a gate of the transistor, a size of a gate of the transistor after a photoresist mask is formed and before an etching process, and a size of a gate of the transistor after etching process of the transistor.

12. The delay time adjustment method according to claim 9, wherein the transistor is formed on a semiconductor substrate formed on the chip, and
the setting voltage comprises information indicating at least one of a bias voltage applied to the semiconductor substrate, a supply voltage applied to a drain or a source of the transistor, and a supply voltage applied to a gate of the transistor for switching of the gate.

13. The delay time adjustment method according to claim 9, wherein the setting voltage generation circuit includes a storage device for registering the setting voltage.

14. The delay time adjustment method according to claim 13, wherein the storing device includes a fuse circuit for storing the setting voltage.

15. The delay time adjustment method according to claim 9, wherein the process data includes position information indicating a position of the transistor of each of the plurality of macros on the chip, and
the selecting includes:
generating voltage-position correspondence data indicating a relation between the position information of each of the plurality of macros and the optimum voltage value selected by the selecting; and
generating integrated voltage-position correspondence data indicating a relation between the position information and the optimum voltage value of each of the plurality of macros which are represented in the voltage-position correspondence data, and setting voltage generation circuit position information indicating a position of the setting voltage generation circuit on the chip, and
the setting includes:
setting the setting voltage of the setting voltage generation circuit of each of the plurality of macros to the optimum voltage value based on the integrated voltage-position correspondence data.

16. The delay time adjustment method according to claim 15, wherein layout data indicating a layout of the plurality of macros is stored in a storage device, and the selecting includes:
obtaining a position of the setting voltage generation circuit of each of the macros by searching the layout data stored in the storage device.

17. A delay time adjustment device for adjusting a delay time of a transistor, applied to a system including:
a semiconductor integrated circuit including a plurality of macros formed on a chip, the transistor and a setting voltage generation circuit designed to apply a setting voltage to the transistor being included in each of the plurality of macros; and
measurement equipment configured to generate process data indicating a size of the transistor and store the process data in a storage device, wherein the device comprises:

a relation table, tangibly embodied in a memory device, configured to store a relation between a plurality of sizes and a plurality of voltage values;

an optimum voltage selection section configured to select a voltage value corresponding to the size of the transistor of each of the plurality of macros indicated in the process data from the plurality of voltage values as an optimum voltage value by referring the relation table; and an optimum voltage set section configured to set the setting voltage of the setting voltage generation circuit of each of the plurality of macros to the optimum voltage value.

18. The delay time adjustment device according to claim 17, wherein the size comprises a size of a gate of the transistor of each of the plurality of macros formed on the chip.

19. The delay time adjustment device according to claim 18, wherein the size comprises information indicating at least one of a size of a mask of a gate of the transistor, a size of a gate of the transistor after a photoresist mask is formed and before an etching process, and a size of a gate of the transistor after etching process of the transistor.

20. The delay time adjustment device according to claim 17, wherein the transistor is formed on a semiconductor substrate formed on the chip, and the setting voltage comprises information indicating at least one of a bias voltage applied to the semiconductor substrate, a supply voltage applied to a drain or a source of the transistor, and a supply voltage applied to a gate of the transistor for switching of the gate.

21. The delay time adjustment device according to claim 17, wherein the process data includes position information indicating a position of the transistor of each of the plurality of macros on the chip, and the optimum voltage selection section includes:

a data generation section configured to generate voltage-position correspondence data indicating a relation between the position information of each of the plurality of macros and the optimum voltage value selected by the selecting; and an integrated data generation section configured to generate integrated voltage-position correspondence data indicating a relation between the position information and the optimum voltage value of each of the plurality of macros which are represented in the voltage-position correspondence data, and setting voltage generation circuit position information indicating a position of the setting voltage generation circuit on the chip, and the optimum voltage set section sets setting voltage of the setting voltage generation circuit of each of the plurality of macros to the optimum voltage value based on the integrated voltage-position correspondence data.

22. The delay time adjustment device according to claim 21, wherein layout data indicating a layout of the plurality of macros is stored in the storage device, and the optimum voltage selection section includes:

a circuit position obtainment section configured to obtain a position of the setting voltage generation circuit of each of the macros by searching the layout data stored in the storage device.

* * * * *